United States Patent
Zhang (10) Patent No.: US 10,163,994 B2
(45) Date of Patent: Dec. 25, 2018

(54) OLED PANEL MANUFACTURING METHOD AND OLED PANEL

(71) Applicant: Shenzhen China Star Optoelectronics Technology Co., Ltd., Shenzhen (CN)

(72) Inventor: Xiaoxing Zhang, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/539,690

(22) PCT Filed: May 16, 2017

(86) PCT No.: PCT/CN2017/084603
§ 371 (c)(1),
(2) Date: Jun. 26, 2017

(65) Prior Publication Data
US 2018/0286931 A1    Oct. 4, 2018

(30) Foreign Application Priority Data
Mar. 30, 2017 (CN) .......................... 2017 1 0202966

(51) Int. Cl.
*H01L 21/00* (2006.01)
*H01L 27/32* (2006.01)
(Continued)

(52) U.S. Cl.
CPC ...... *H01L 27/3246* (2013.01); *H01L 51/0004* (2013.01); *H01L 51/56* (2013.01); *H01L 2227/323* (2013.01)

(58) Field of Classification Search
CPC ............. H01L 27/3246; H01L 27/3251; H01L 27/3253; H01L 27/3258; H01L 27/326;
(Continued)

(56) References Cited

U.S. PATENT DOCUMENTS 6,417,523 B1 * 7/2002 Swanson ............. H01L 27/3209
257/81
2016/0049601 A1 * 2/2016 Hsieh ....................... H01L 21/78
257/40

FOREIGN PATENT DOCUMENTS

CN         1893106 A    1/2007
CN        102226998 A   10/2011
(Continued)

*Primary Examiner* — Richard Booth
(74) *Attorney, Agent, or Firm* — Leong C. Lei (57) ABSTRACT

The invention provides an OLED panel manufacturing method and OLED panel. The method comprises: forming first (21) and second (22) pixel electrodes inside each pixel unit (2); depositing an insulation film by an atomic layer deposition method, and patternizing to form a pixel electrode isolation insulation layer (3); the pixel electrode isolation insulation layer having a longitudinal portion (31) filling between the first (21) and second (22) pixel electrodes, and a latitudinal portion (32) having both ends covering respectively a part of the first pixel electrode (21) closer to the second pixel electrode (22) and a part of the second pixel electrode (22) closer to the first pixel electrode (21); forming a pixel isolation layer (4), and printing LOED elements (5); the invention can increase OLED panel resolution without changing printing accuracy so that the first (21) and second (22) pixel electrodes are completely insulated.

10 Claims, 5 Drawing Sheets

(51) Int. Cl.
*H01L 51/56* (2006.01)
*H01L 51/00* (2006.01)

(58) Field of Classification Search
CPC . H01L 51/0004; H01L 51/0005; H01L 51/56; H01L 2227/32; H01L 2227/323
See application file for complete search history.

(56) References Cited

FOREIGN PATENT DOCUMENTS

| | | | |
|---|---|---|---|
| CN | 105045012 A | 11/2015 | |
| JP | 5486920 B2 | 5/2014 | |

* cited by examiner

OLED PANEL MANUFACTURING METHOD AND OLED PANEL

BACKGROUND OF THE INVENTION

1. Field of the Invention

The present invention relates to the field of display, and in particular to an organic light-emitting diode (OLED) panel manufacturing method and OLED panel.

2. The Related Arts

The organic light-emitting diode (OLED) panel has the advantages of active light-emitting, low driving voltage, high emission efficiency, quick response time, high resolution and contrast, near 180° viewing angle, wide operation temperature range, and capability to realize flexible display and large-area full-color display, and is regarded as the most promising display technology.

Figure 1:
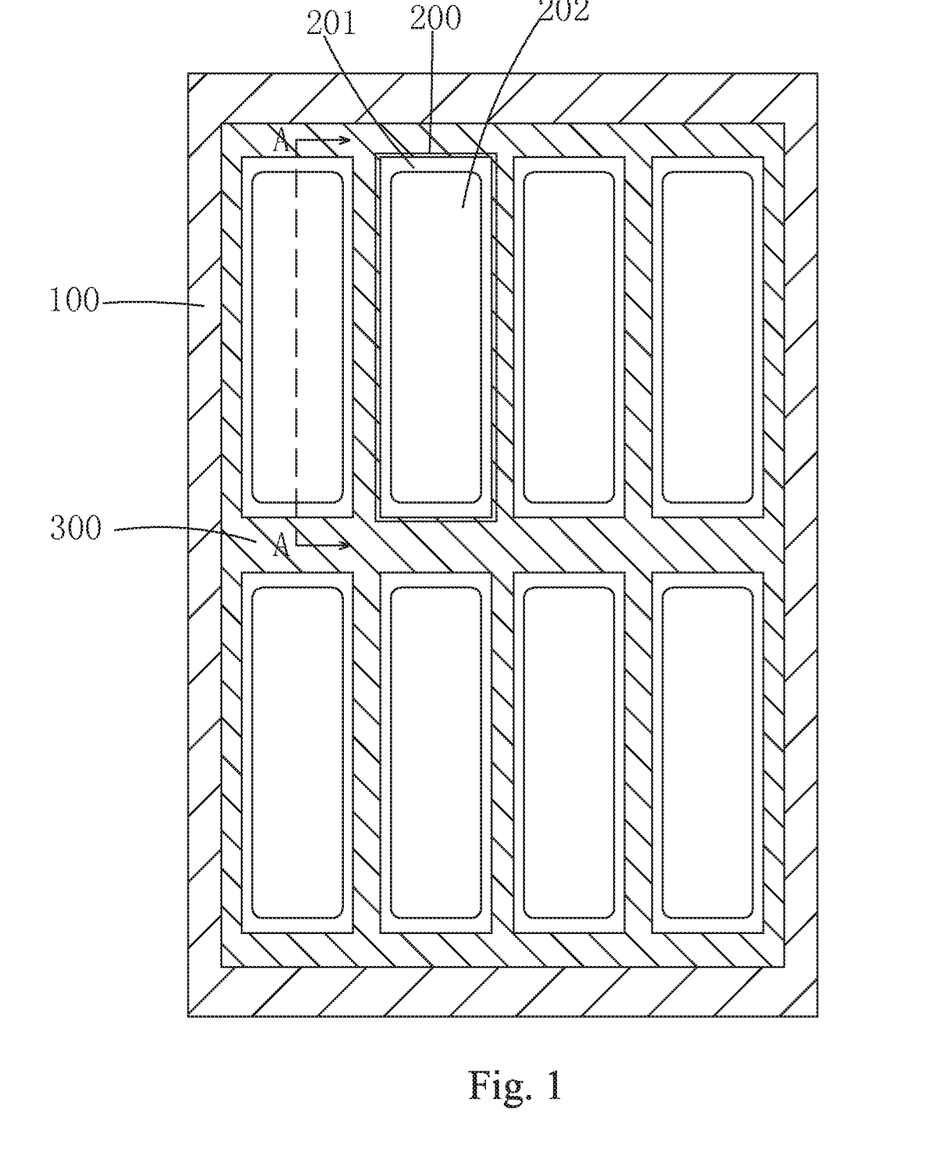
FIG. 1 is a schematic view showing the structure of a known OLED panel.
Figure 2:
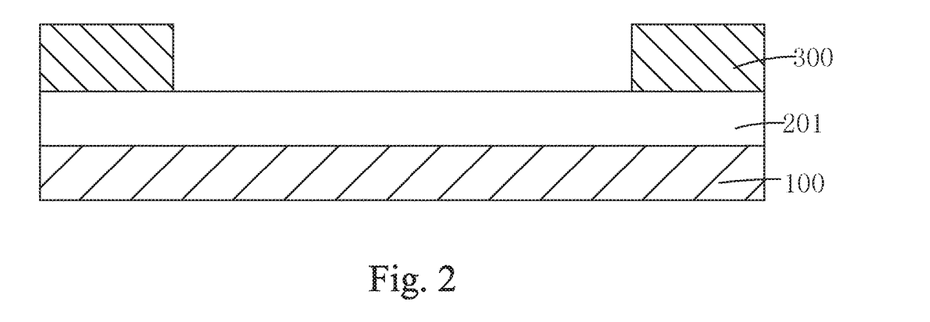
FIG. 2 is a schematic view showing the A-A cross-section in FIG. 1.

Refer to FIG. 1 and FIG. 2. A conventional OLED panel comprises: a thin film transistor (TFT) substrate 100, a plurality of pixel units 200 arranged in an array on the TFT substrate 100, a pixel isolation layer 300 filling between adjacent pixel units 200 in the array of the plurality of pixel units to isolate each pixel unit 200 from adjacent pixel units 20, wherein each pixel unit 200 being disposed with a complete block of pixel electrode 201, and an OLED light-emitting device 202 being deposited on the pixel electrode 201. Specifically, the OLED light-emitting device 202 comprises a stack, in subsequent order, of a hole injection layer (HIL), a hole transport layer (HTL), a light-emitting layer (EML), an electron transport layer (ETL), an electron injection layer (EIL) and an cathode, disposed on the pixel electrode 201. The pixel electrode 201 also serves as an anode of the OLED light-emitting device 202. The light-emitting principle behind the OLED light-emitting device 202 is: under a certain voltage driving, the electrons and the holes are injected respectively into the HIL layer and EIL layer from the cathode and the anode. The electrons and the holes are then transported to meet in the EML layer through the ETL layer and HTL layer respectively to form exciton to excite the luminescent molecules, which emit visible light by radiation relaxation.

In the OLED panel manufacturing process, because the printing technology can significantly reduce the cost of OLED materials, and attracts more and more attention. However, due to the printing contemporary printing capability limitation, it is difficult to use a printing process to manufacture a high-resolution (e.g., 4K) OLED panel. The main reason is that the contemporary printing technology is unable to perfectly print an OLED light-emitting device 202 in a very small pixel unit, due to ink overflow, and resulting in color mixing.

SUMMARY OF THE INVENTION

The object of the present invention is to provide an OLED panel manufacturing method, able to increase OLED panel resolution without changing printing accuracy to achieve stable, reliable isolation and insulation between pixel electrodes.

Another object of the present invention is to provide an OLED, panel, with higher resolution as well as stable, reliable isolation and insulation between pixel electrodes.

To achieve the above object, the present invention provides an organic light-emitting diode (OLED) manufacturing method, comprising the steps of:

Step S1: providing a thin film transistor (TFT) substrate;

Step S2: depositing a conductive film on the TFT substrate, patternizing the conductive film according to an array to be formed of a plurality of pixel units to obtain a first pixel electrode inside each pixel unit and a second pixel electrode separated from the first pixel electrode;

Step S3: depositing an insulation film by an atomic layer deposition method, and patternizing the insulation film to form a pixel electrode isolation insulation layer;

the pixel electrode isolation insulation layer comprising: a longitudinal portion and a latitudinal portion perpendicularly connected to the longitudinal portion, the longitudinal portion filling between the first and second pixel electrodes, and the latitudinal portion having both ends covering respectively a part of the first pixel electrode closer to the second pixel electrode and a part of the second pixel electrode closer to the first pixel electrode;

Step S4: forming a pixel isolation layer among pixel units to be formed for isolating each of the plurality of pixel units to be arranged in an array;

Step S5: printing a corresponding number of OLED light-emitting devices on the first pixel electrode, second pixel electrode, and the pixel electrode isolation insulation layer to correspond to the plurality of pixel units to be formed and arranged in an array;

the first pixel electrode, second pixel electrode, pixel electrode isolation insulation layer and OLED light-emitting device forming a pixel unit.

According to a preferred embodiment of the present invention, the TFT substrate has a thickness of 500 Å to 1000 Å.

According to a preferred embodiment of the present invention, the conductive film is made of indium-tin-oxide (ITO).

According to a preferred embodiment of the present invention, the insulation film is made of silicon oxide, with a thickness of 200 Å to 500 Å.

The present invention also provides an organic light-emitting diode (OLED) panel, comprising: a thin film transistor (TFT) substrate, a plurality of pixel units arranged in an array on the TFT substrate, a pixel isolation layer filling between adjacent pixel units in the array of the plurality of pixel units to isolate each pixel unit from adjacent pixel units;

each pixel unit being disposed with a first pixel electrode, a second pixel electrode, a pixel electrode isolation insulation layer for isolating and insulating the first and second pixel electrodes, and an OLED light-emitting device deposited on the first pixel electrode, second pixel electrode, and the pixel electrode isolation insulation layer;

the pixel electrode isolation insulation layer being obtained by forming an insulation film by an atomic layer deposition method and patternizing the insulation film to form the pixel electrode isolation insulation layer; the pixel electrode isolation insulation layer comprising: a longitudinal portion and a latitudinal portion perpendicularly connected to the longitudinal portion, the longitudinal portion filling between the first and second pixel electrodes, and the latitudinal portion having both ends covering respectively a part of the first pixel electrode closer to the second pixel electrode and a part of the second pixel electrode closer to the first pixel electrode.

According to a preferred embodiment of the present invention, the TFT substrate has a thickness of 500 Å to 1000 Å.

According to a preferred embodiment of the present invention, the first pixel electrode and the second pixel electrode are made of indium-tin-oxide (ITO).

According to a preferred embodiment of the present invention, the pixel electrode isolation insulation layer is made of silicon oxide, with a thickness of 200 Å to 500 Å.

The present invention further provides an organic light-emitting diode (OLED) manufacturing method, comprising the steps of:

Step S1: providing a thin film transistor (TFT) substrate;

Step S2: depositing a conductive film on the TFT substrate, patternizing the conductive film according to an array to be formed of a plurality of pixel units to obtain a first pixel electrode inside each pixel unit and a second pixel electrode separated from the first pixel electrode;

Step S3: depositing an insulation film by an atomic layer deposition method, and patternizing the insulation film to form a pixel electrode isolation insulation layer;

the pixel electrode isolation insulation layer comprising: a longitudinal portion and a latitudinal portion perpendicularly connected to the longitudinal portion, the longitudinal portion filling between the first and second pixel electrodes, and the latitudinal portion having both ends covering respectively a part of the first pixel electrode closer to the second pixel electrode and a part of the second pixel electrode closer to the first pixel electrode;

Step S4: forming a pixel isolation layer among pixel units to be formed for isolating each of the plurality of pixel units to be arranged in an array;

Step S5: printing a corresponding number of OLED light-emitting devices on the first pixel electrode, second pixel electrode, and the pixel electrode isolation insulation layer to correspond to the plurality of pixel units to be formed and arranged in an array;

the first pixel electrode, second pixel electrode, pixel electrode isolation insulation layer and OLED light-emitting device forming a pixel unit.

wherein the TFT substrate having a thickness of 500 Å to 1000 Å.

wherein the conductive film being made of indium-tin-oxide (ITO).

Compared to the known techniques, the present invention provides the following advantages: the present invention provides an OLED panel manufacturing method, forming a first pixel electrode inside each pixel unit and a second pixel electrode separated from the first pixel electrode; depositing an insulation film by an atomic layer deposition method, and patternizing to form a pixel electrode isolation insulation layer; the pixel electrode isolation insulation layer having a longitudinal portion filling between the first and second pixel electrodes, and a latitudinal portion having both ends covering respectively a part of the first pixel electrode closer to the second pixel electrode and a part of the second pixel electrode closer to the first pixel electrode; forming a pixel isolation layer, and printing LOED elements; the present invention can increase OLED panel resolution without changing printing accuracy so that the first and second pixel electrodes are completely insulated, to achieve reducing lateral leakage between the first and second pixel electrodes. The present invention provides an OLED panel, each pixel unit disposed with a first pixel electrode, a second pixel electrode, a pixel electrode isolation insulation layer for isolating and insulating the first and second pixel electrodes, and an OLED light-emitting device deposited on the first pixel electrode, second pixel electrode, and the pixel electrode isolation insulation layer; the pixel electrode isolation insulation layer can assure complete insulation between the first and second pixel electrodes and reduce lateral leakage between the first and second pixel electrodes.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

To further explain the technical means and effect of the present invention, the following refers to embodiments and drawings for detailed description.

Figure 3:
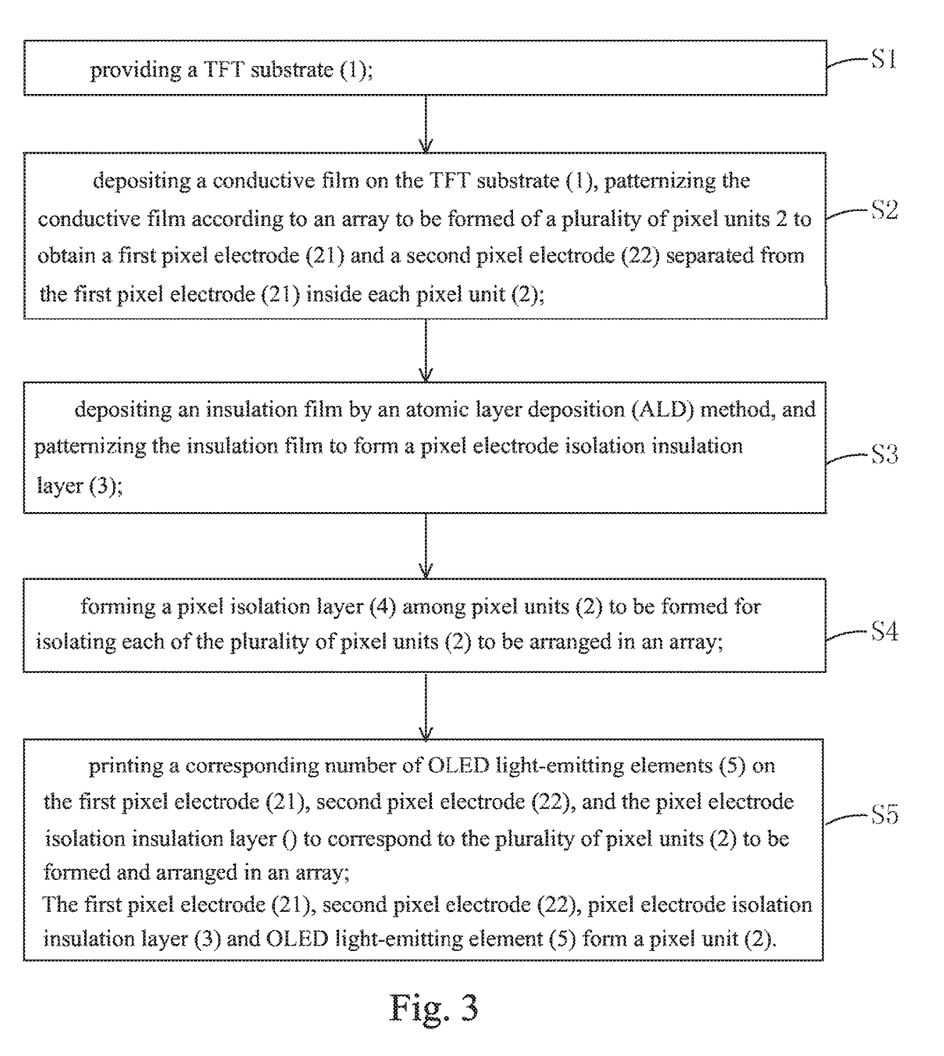
FIG. 3 is a schematic view showing the flowchart of the OLED panel manufacturing method provided by an embodiment of the present invention.
Figure 4:
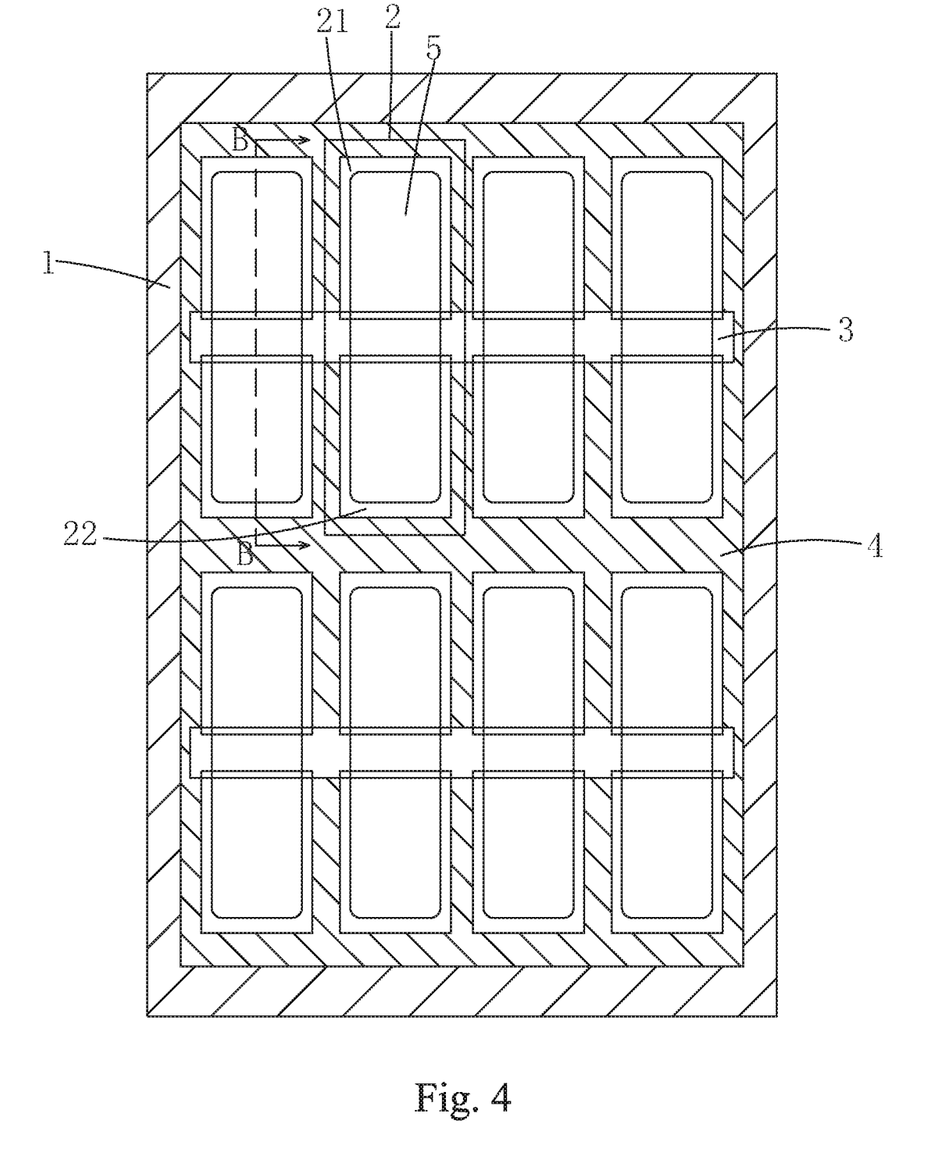
FIG. 4 is a schematic view showing the structure of the OLED panel provided by an embodiment of the present invention.
Figure 5:
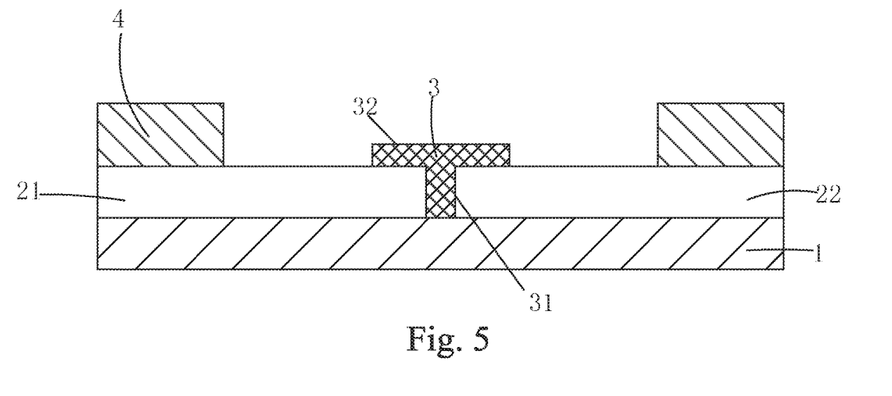
FIG. 5 is a schematic view showing the B-B cross-section in FIG. 4.

Refer to FIG. 3, in combination with FIGS. 4 and FIG. 5. The present invention provides an organic light-emitting diode (OLED) manufacturing method, comprising the steps of:

Step S1: providing a thin film transistor (TFT) substrate 1.

Specifically, the TFT substrate 1 has a thickness of 500 Å to 1000 Å, which usually comprises a glass base, gates, scan lines, gate insulation layer, active layer, interlayer insulation layer, sources, drains, data lines, and so on, and is the same as the prior art; thus, the detailed description will be omitted.

Step S2: depositing a conductive film on the TFT substrate 1, patternizing the conductive film according to an array to be formed of a plurality of pixel units 2 to obtain a first pixel electrode 21 inside each pixel unit 2 and a second pixel electrode 22 separated from the first pixel electrode 21.

Specifically, in Step S2, the conductive film is made of indium-tin-oxide (ITO).

It should be noted that in the conventional technology, each pixel unit is disposed with a complete block of pixel electrode, while the Step S2, each pixel unit 2 is disposed with a first pixel electrode 21 and a second pixel electrode 22 separated from the first pixel electrode 21. In other words, each pixel is disposed with two blocks of pixel electrodes (called 2-in-1 structure), able to increase resolution of the OLED panel.

Step S3: depositing an insulation film by an atomic layer deposition (ALD) method, and patternizing the insulation film to form a pixel electrode isolation insulation layer 3.

The pixel electrode isolation insulation layer 3 comprises: a longitudinal portion 31 and a latitudinal portion 32 perpendicularly connected to the longitudinal portion 31, the longitudinal portion 31 filling between the first and second pixel electrodes 21, 22, and the latitudinal portion 32 having both ends covering respectively a part of the first pixel electrode 21 closer to the second pixel electrode 22 and a part of the second pixel electrode 22 closer to the first pixel electrode 21.

Since the ITO have irregular bevels after patterned by the etching process, if a conventional chemical deposition method is used to fabricate the pixel electrode isolation insulation layer 3, the pixel electrode isolation insulation layer 3 may not cover a part of the first pixel electrode 21 closer to the second pixel electrode 22 and a part of the second pixel electrode 22 closer to the first pixel electrode 21 well, which will result in the first and second pixel electrodes 21, 22 in a pixel unit 2 not completely insulated and lead to a lateral current leakage problem between the two pixel electrodes. In the present invention, the ALD process is used to coat a material layer by layer in a form of single atomic film on the substrate surface; therefore, the result can match the corresponding parts of the first pixel electrode 21 and the second pixel electrode 22. As such, the pixel electrode isolation insulation layer 3 obtained in Step S3 can make the first and second pixel electrodes 21, 22 completely insulated from each other, and reduce the possibility of lateral current leakage between the first pixel electrode 21 and second pixel electrode 22.

Specifically, the insulation film is made of silicon oxide ($SiO_x$), with a thickness of 200 Å to 500 Å.

Step S4: forming a pixel isolation layer 4 among pixel units 2 to be formed for isolating each of the plurality of pixel units 2 to be arranged in an array.

Furthermore, the pixel isolation layer 4 also covers a portion of the first pixel electrode 21 away from the pixel electrode isolation insulation layer 3 in each pixel units 2 and a portion of the second pixel electrode 22 away from the pixel electrode isolation insulation layer 3 in each pixel units 2, to ensure complete insulation between the plurality of pixel units 2.

Step S5: printing a corresponding number of OLED light-emitting devices 5 on the first pixel electrode 21, second pixel electrode 22, and the pixel electrode isolation insulation layer 3 to correspond to the plurality of pixel units 2 to be formed and arranged in an array.

The first pixel electrode 21, second pixel electrode 22, pixel electrode isolation insulation layer 3 and OLED light-emitting device 5 form a pixel unit 2.

Specifically, the OLED light-emitting device 5 comprises a hole injecting layer, a hole transport layer, a light emitting layer, an electron transport layer, an electron transport layer, and a cathode, which are sequentially stacked on the first pixel electrode 21, the second pixel electrode 22, and the pixel electrode isolation insulation layer 3. The first pixel electrode 21 and the second pixel electrode 22 serve simultaneously as the anode of the OLED light emitting element 5.

Because the above steps fabricate the first pixel electrode 21 and the second pixel electrode 22 in each of the pixel unit 2, and the pixel electrode isolation insulation layer 3 is made so that the first and second pixel electrodes 21, 22 are insulated from each other to improve the resolution of the OLED panel. Step S5 does not need to improve the printing accuracy of the OLED light-emitting device 5 to improve resolution, thereby facilitating the progress of the printing process.

Based on the aforementioned method, the present invention also provides an organic light-emitting diode (OLED) panel. Refer to FIG. 4 and FIG. 5. The OLED panel of the present invention comprises: a thin film transistor (TFT) substrate 1, a plurality of pixel units 2 arranged in an array on the TFT substrate 1, a pixel isolation layer 4 filling between adjacent pixel units 2 in the array of the plurality of pixel units 2 to isolate each pixel unit 2 from adjacent pixel units 2.

Each pixel unit 2 is disposed with a first pixel electrode 21, a second pixel electrode 22, a pixel electrode isolation insulation layer 3 for isolating and insulating the first and second pixel electrodes 21, 22, and an OLED light-emitting device 5 deposited on the first pixel electrode 21, second pixel electrode 22, and the pixel electrode isolation insulation layer 3.

The pixel electrode isolation insulation layer 3 is obtained by forming an insulation film by an atomic layer deposition (ALD) method and patternizing the insulation film to form the pixel electrode isolation insulation layer 3; the pixel electrode isolation insulation layer 3 comprises: a longitudinal portion 31 and a latitudinal portion 32 perpendicularly connected to the longitudinal portion 31, the longitudinal portion 31 filling between the first and second pixel electrodes 21, 22, and the latitudinal portion 32 having both ends covering respectively a part of the first pixel electrode 21 closer to the second pixel electrode 22 and a part of the second pixel electrode 22 closer to the first pixel electrode 21.

Furthermore, the pixel isolation layer 4 also covers a portion of the first pixel electrode 21 away from the pixel electrode isolation insulation layer 3 in each pixel units 2 and a portion of the second pixel electrode 22 away from the pixel electrode isolation insulation layer 3 in each pixel units 2, to ensure complete insulation between the plurality of pixel units 2.

Specifically, the TFT substrate 1 has a thickness of 500 Å to 1000 ÅA, which usually comprises a glass base, gates, scan lines, gate insulation layer, active layer, interlayer insulation layer, sources, drains, data lines, and so on, and is the same as the prior art; thus, the detailed description will be omitted.

The first pixel electrode 21 and the second pixel electrode 22 are made of indium-tin-oxide (ITO).

The pixel electrode isolation insulation layer 3 is made of silicon oxide, with a thickness of 200 Å to 500 Å.

The OLED light-emitting device 5 comprises a hole injecting layer, a hole transport layer, a light emitting layer, an electron transport layer, an electron transport layer, and a cathode, which are sequentially stacked on the first pixel electrode 21, the second pixel electrode 22, and the pixel electrode isolation insulation layer 3. The first pixel electrode 21 and the second pixel electrode 22 serve simultaneously as the anode of the OLED light emitting element 5.

In the present invention, each pixel unit 2 of the OLED panel is disposed with a first pixel electrode 21 and a second pixel electrode 22 separated from the first pixel electrode 21. In other words, each pixel is disposed with two blocks of pixel electrodes (called 2-in-1 structure), able to increase resolution of the OLED panel. Because pixel electrode isolation insulation layer 3 is obtained by forming an insulation film by an atomic layer deposition (ALD) method and patternizing the insulation film, the result can match the corresponding parts of the first pixel electrode 21 and the second pixel electrode 22. As such, the pixel electrode isolation insulation layer 3 obtained in Step S3 can make the first and second pixel electrodes 21, 22 completely insulated from each other, and reduce the possibility of lateral current leakage between the first pixel electrode 21 and second pixel electrode 22.

In summary, the present invention provides an OLED panel manufacturing method, forming a first pixel electrode inside each pixel unit and a second pixel electrode separated from the first pixel electrode; depositing an insulation film by an atomic layer deposition method, and patternizing to form a pixel electrode isolation insulation layer; the pixel electrode isolation insulation layer having a longitudinal portion filling between the first and second pixel electrodes, and a latitudinal portion having both ends covering respectively a part of the first pixel electrode closer to the second pixel electrode and a part of the second pixel electrode closer to the first pixel electrode; forming a pixel isolation layer, and printing LOED elements; the present invention can increase OLED panel resolution without changing printing accuracy so that the first and second pixel electrodes are completely insulated, to achieve reducing lateral leakage between the first and second pixel electrodes. The present invention provides an OLED panel, each pixel unit disposed with a first pixel electrode, a second pixel electrode, a pixel electrode isolation insulation layer for isolating and insulating the first and second pixel electrodes, and an OLED light-emitting device deposited on the first pixel electrode, second pixel electrode, and the pixel electrode isolation insulation layer; the pixel electrode isolation insulation layer can assure complete insulation between the first and second pixel electrodes and reduce lateral leakage between the first and second pixel electrodes.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the clams of the present invention.

What is claimed is:

1. An organic light-emitting diode (OLED) manufacturing method, comprising the steps of:
   Step S1: providing a thin film transistor (TFT) substrate;
   Step S2: depositing a conductive film on the TFT substrate, patternizing the conductive film according to an array to be formed of a plurality of pixel units to obtain a first pixel electrode inside each pixel unit and a second pixel electrode separated from the first pixel electrode;
   Step S3: depositing an insulation film by an atomic layer deposition method, and patternizing the insulation film to form a pixel electrode isolation insulation layer;
   the pixel electrode isolation insulation layer comprising: a longitudinal portion and a latitudinal portion perpendicularly connected to the longitudinal portion, the longitudinal portion filling between the first and second pixel electrodes, and the latitudinal portion having both ends covering respectively a part of the first pixel electrode closer to the second pixel electrode and a part of the second pixel electrode closer to the first pixel electrode;
   Step S4: forming a pixel isolation layer among pixel units to be formed for isolating each of the plurality of pixel units to be arranged in an array;
   Step S5: printing a corresponding number of OLED light-emitting devices on the first pixel electrode, second pixel electrode, and the pixel electrode isolation insulation layer to correspond to the plurality of pixel units to be formed and arranged in an array; the first pixel electrode, second pixel electrode, pixel electrode isolation insulation layer and OLED light-emitting device forming a pixel unit.

2. The OLED panel manufacturing method as claimed in claim 1, wherein the TFT substrate has a thickness of 500 Å to 1000 Å.

3. The OLED panel manufacturing method as claimed in claim 1, wherein the conductive film is made of indium-tin-oxide (ITO).

4. The OLED panel manufacturing method as claimed in claim 1, wherein the insulation film is made of silicon oxide, with a thickness of 200 Å to 500 Å.

5. An organic light-emitting diode (OLED) panel, comprising: a thin film transistor (TFT) substrate, a plurality of pixel units arranged in an array on the TFT substrate, a pixel isolation layer filling between adjacent pixel units in the array of the plurality of pixel units to isolate each pixel unit from adjacent pixel units;
   each pixel unit being disposed with a first pixel electrode, a second pixel electrode, a pixel electrode isolation insulation layer for isolating and insulating the first and second pixel electrodes, and an OLED light-emitting device deposited on the first pixel electrode, second pixel electrode, and the pixel electrode isolation insulation layer;
   the pixel electrode isolation insulation layer being obtained by forming an insulation film by an atomic layer deposition method and patternizing the insulation film to form the pixel electrode isolation insulation layer; the pixel electrode isolation insulation layer comprising: a longitudinal portion and a latitudinal portion perpendicularly connected to the longitudinal portion, the longitudinal portion filling between the first and second pixel electrodes, and the latitudinal portion having both ends covering respectively a part of the first pixel electrode closer to the second pixel electrode and a part of the second pixel electrode closer to the first pixel electrode.

6. The OLED panel as claimed in claim 5, wherein the TFT substrate has a thickness of 500 Å to 1000 Å.

7. The OLED panel as claimed in claim 5, wherein the first pixel electrode and the second pixel electrode are made of indium-tin-oxide (ITO).

8. The OLED panel as claimed in claim 5, wherein the pixel electrode isolation insulation layer is made of silicon oxide, with a thickness of 200 Å to 500 Å.

9. An organic light-emitting diode (OLED) manufacturing method, comprising the steps of:
   Step S1: providing a thin film transistor (TFT) substrate;
   Step S2: depositing a conductive film on the TFT substrate, patternizing the conductive film according to an array to be formed of a plurality of pixel units to obtain a first pixel electrode inside each pixel unit and a second pixel electrode separated from the first pixel electrode; Step
   S3: depositing an insulation film by an atomic layer deposition method, and patternizing the insulation film to form a pixel electrode isolation insulation layer;
   the pixel electrode isolation insulation layer comprising: a longitudinal portion and a latitudinal portion perpendicularly connected to the longitudinal portion, the longitudinal portion filling between the first and second pixel electrodes, and the latitudinal portion having both ends covering respectively a part of the first pixel electrode closer to the second pixel electrode and a part of the second pixel electrode closer to the first pixel electrode;

Step S4: forming a pixel isolation layer among pixel units to be formed for isolating each of the plurality of pixel units to be arranged in an array;

Step S5: printing a corresponding number of OLED light-emitting devices on the first pixel electrode, second pixel electrode, and the pixel electrode isolation insulation layer to correspond to the plurality of pixel units to be formed and arranged in an array;

the first pixel electrode, second pixel electrode, pixel electrode isolation insulation layer and OLED light-emitting device forming a pixel unit;

wherein the TFT substrate having a thickness of 500 Å to 1000 Å;

wherein the conductive film being made of indium-tin-oxide (ITO).

10. The OLED panel manufacturing method as claimed in claim 9, wherein the insulation film is made of silicon oxide, with a thickness of 200 Å to 500 Å.

* * * * *